United States Patent
Yang et al.

(10) Patent No.: US 12,376,368 B2
(45) Date of Patent: Jul. 29, 2025

(54) METHOD FOR MAKING SEMI-FLOATING GATE TRANSISTOR WITH THREE-GATE STRUCTURE

(71) Applicant: Shanghai Huali Integrated Circuit Corporation, Shanghai (CN)

(72) Inventors: Zhigang Yang, Shanghai (CN); Heng Liu, Shanghai (CN); Xiaoying Meng, Shanghai (CN); Jianghua Leng, Shanghai (CN); Tianpeng Guan, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 669 days.

(21) Appl. No.: 17/752,735

(22) Filed: May 24, 2022

(65) Prior Publication Data

US 2022/0384272 A1    Dec. 1, 2022

(30) Foreign Application Priority Data

May 25, 2021   (CN) .......................... 202110568403.6

(51) Int. Cl.
*H10D 84/01*    (2025.01)
*H10D 30/01*    (2025.01)
(Continued)

(52) U.S. Cl.
CPC ....... *H10D 84/016* (2025.01); *H10D 30/0411* (2025.01); *H10D 30/68* (2025.01);
(Continued)

(58) Field of Classification Search
CPC .. H10D 84/016; H10D 30/0411; H10D 30/68; H10D 62/115; H10D 84/0151;
(Continued)

(56) References Cited

U.S. PATENT DOCUMENTS 7,626,230 B2 *  12/2009  Joo ...................... H10D 64/037
                                              257/334
7,700,441 B2 *  4/2010   Kim ..................... H10D 84/016
                                              438/270
(Continued)

FOREIGN PATENT DOCUMENTS

CN           101110449 A        1/2008
CN           104916639 A        9/2015
(Continued)

OTHER PUBLICATIONS

Peng-Fei Wang, "A Semi-Floating Gate Transistor for Low-Voltage Ultrafast Memory and Sensing Operation" Aug. 9, 2013.
Jan. 26, 2024—(CN) First Search Report—App 2021105684036.

*Primary Examiner* — Su C Kim
(74) *Attorney, Agent, or Firm* — Banner & Witcoff, Ltd.

(57) ABSTRACT

A method for making a semi-floating gate transistor with a three-gate structure is disclosed, comprising: forming a first trench structure in isolated active regions and a first polysilicon layer, removing part of the first polysilicon layer; forming a second gate oxide layer and a second polysilicon layer; patterning isolation trench; filling an isolation dielectric layer in the isolation trench; and forming a trench between two first trench structures, to cut open the second polysilicon layer, the second gate oxide layer, the first polysilicon layer and the first gate oxide layer into two parts, so that the active region is exposed from the bottom of the trench, wherein the first polysilicon layer on either side of the trench forms a first gate, and portions of the second polysilicon layer on both sides of the isolation trench form a second gate and a third gate.

8 Claims, 3 Drawing Sheets

(51) Int. Cl.
    *H10D 30/68*     (2025.01)
    *H10D 62/10*     (2025.01)
    *H10D 84/03*     (2025.01)

(52) U.S. Cl.
    CPC ....... *H10D 62/115* (2025.01); *H10D 84/0151* (2025.01); *H10D 84/038* (2025.01)

(58) Field of Classification Search
    CPC ............ H10D 84/038; H10D 30/6892; H10D 30/681; H10D 30/6894; H10D 64/035; H10D 30/6891; H10B 41/30
    See application file for complete search history.

(56) References Cited

U.S. PATENT DOCUMENTS

| | | | | |
|---|---|---|---|---|
| 8,133,794 | B2* | 3/2012 | Tischler | ............ H01L 21/76232 |
| | | | | 257/E21.573 |
| 2015/0303207 | A1* | 10/2015 | Liu | .................... H10D 30/6894 |
| | | | | 257/316 |
| 2018/0286960 | A1* | 10/2018 | Huo | ..................... H10D 62/116 |

FOREIGN PATENT DOCUMENTS

| | | | |
|---|---|---|---|
| CN | 106206737 | A | 12/2016 |
| CN | 107305892 | A | 10/2017 |
| CN | 107316868 | A | 11/2017 |

\* cited by examiner

METHOD FOR MAKING SEMI-FLOATING GATE TRANSISTOR WITH THREE-GATE STRUCTURE

TECHNICAL FIELD

The present application relates to semiconductor integrated circuit manufacturing technology, in particular, to a method for making a semi-floating gate transistor with a three-gate structure and a device.

BACKGROUND

The existing device making processes historically have been planar stacking technologies until they came to the FinFET process. Whether it is 28 LP (28 nm low power) or 28 HK (28 nm high-dielectric constant K) metal gate process, the gate made is formed through planar stacking. However, the current planar stacking technology cannot meet requirements of the process for making three-gate semi-floating gate devices. The main cause is that the third gate is a structure with long side perpendicular to the first and second gates.

BRIEF SUMMARY

The purpose of the present application is to provide a method for making a semi-floating gate transistor with a three-gate structure. The method comprises: S1: providing a semiconductor substrate, forming isolated active regions on the semiconductor substrate, forming a first-doping-type deep well in each of the active regions, and forming a first trench structure in the first-doping-type deep well; S2: forming a first polysilicon layer wherein the first polysilicon layer fills the first trench structure and covers a surface of the active region; S3: removing the first polysilicon layer from two sides of the surface of the active region and from a first gate oxide layer under the first polysilicon layer, and retaining the first polysilicon layer on the surface of the active region, as well as between the first trench structures and the first gate oxide layer under the first polysilicon layer; S4: forming a second gate oxide layer, wherein the second gate oxide layer covers the surface of the exposed active region, side surfaces and an upper surface of the first polysilicon layer, and forming a second polysilicon layer, wherein the second polysilicon layer covers the second gate oxide layer; S5: forming a photoresist layer, forming an isolation trench pattern through a lithographic exposure and development process, wherein the isolation trench pattern is located between two sides of the remaining first polysilicon layer, and removing the second polysilicon layer and the second gate oxide layer in the isolation trench pattern until the active region is exposed from a bottom of the isolation trench pattern and the side surfaces of the first polysilicon layer, so that an isolation trench is formed from the isolation trench pattern; S6: filling an isolation dielectric layer in the isolation trench; and S7: forming a trench between two first trench structures, wherein the trench cuts open the second polysilicon layer, the second gate oxide layer, the first polysilicon layer and the first gate oxide layer between the first trench structures into two parts, so that the active region is exposed from a bottom of the trench, wherein the first polysilicon layer on either side of the trench forms a first gate, and wherein portions of the second polysilicon layer on both sides of the isolation trench respectively form a second gate and a third gate.

Further, the first-doping-type deep well is an N-type doped deep well.

Further, the first trench structure is a U-shaped trench structure.

Further, the depth of the first trench structure is in the range of 100 nm-200 nm and the width is in the range of 30 nm-50 nm.

Further, before forming the first polysilicon layer in S2, the method further includes S21: forming a first gate oxide layer, wherein the first gate oxide layer covers the surfaces of the active region and the first trench structure.

Further, the thickness of the first gate oxide layer is in the range of 3 nm-5 nm.

Further, the thickness of the first polysilicon layer is in the range of 10 nm-30 nm.

Further, the thickness of the second polysilicon layer is in the range of 30 nm-80 nm.

Further, the width of the isolation trench is in the range of 20 nm-50 nm.

Further, a layer of thin film is deposited on the after the step of S7, then sidewalls are formed on two sides of the second gate and the third gate through dry etching to protect the sidewalls of the second gate and the third gate and support the second gate and the third gate, the region of the second gate and/or the third gate is exposed through a lithography process, the second gate and/or the third gate is removed through dry etching to form a trench of the region of the second gate and/or the third gate respectively wrapped by sidewalls on two sides, and a metal gate is deposited in the trench of the region of the second gate and/or the third gate to form a semi-floating gate device transistor with a three-gate structure in which at least one gate is a metal gate.

DETAILED DESCRIPTION OF THE DISCLOSURE

Figure 1A:
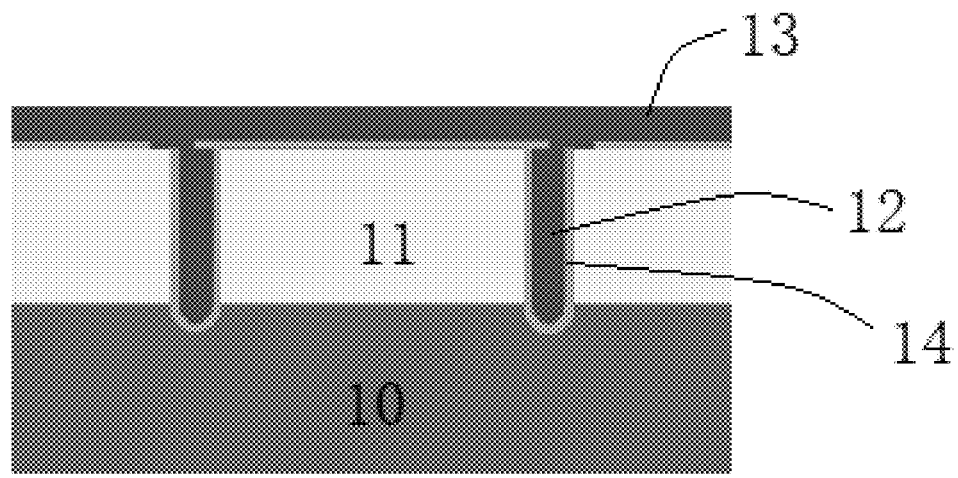
FIG. 1a to FIG. 1f are schematic cross sectional views in steps of a process making a semi-floating gate transistor with a three-gate structure according to an embodiment of the present application.

The technical solution of the present application will be clearly and completely described below with reference to the drawings. Obviously, the described embodiments are part of the embodiments of the present application, not all of them. Based on the embodiments of the present application, all other embodiments obtained by ordinary technicians in the art without contributing any inventive labor fall within the scope of protection of the present application.

It should be understood that the present application may be implemented in different forms and should not be construed as limited to the embodiments provided herein. On the contrary, providing these embodiments will make the disclosure thorough and complete, and completely convey the scope of the present application to those skilled in the art. In the drawings, for clarity, the dimensions and relative dimensions of layers and regions may be exaggerated, and the same reference signs represent the same elements from beginning to end. It should be understood that when an element or layer is referred to as "on", "adjacent to", "connected to" or "coupled to" other elements or layers, it may be directly on, adjacent to, connected to or coupled to other elements or layers, or there may be intermediate elements or layers. Conversely, when an element is referred to as "directly on", "directly adjacent to", "directly connected to" or "directly coupled to" other elements or layers, there is no intermediate element or layer. It should be understood that although the terms first, second, third and the like may be used to describe various elements, components, regions, layers and/or parts, these elements, components, regions, layers and/or parts should not be limited by these terms. These terms are only used to distinguish one element, component, region, layer or part from another element, component, region, layer or part. Therefore, without departing from the teachings of the present application, a first element, component, region, layer or part discussed below may be represented as a second element, component, region, layer or part.

Spatial relationship terms, such as "underneath", "under", "lower", "below", "above" and "upper", may be used here for convenience of description, so as to describe a relationship between one element or feature and other elements or features illustrated in the drawings. It should be understood that in addition to the orientations illustrated in the drawings, the spatial relationship terms are intended to include different orientations of devices in use and operation. For example, if a device in the drawing is flipped, then an element or feature described as "under" or "underneath" or "below" other elements will be oriented "above" the other element or feature. Therefore, exemplary terms "under" and "below" are included upward and downward orientations. The device may be otherwise oriented (rotated 90 degrees or oriented in other directions) and the spatial descriptors used herein are interpreted accordingly.

The terms used herein are intended only to describe specific embodiments and are not limitations of the present application. When used herein, singular forms "a/an", "one" and "said/the" are also intended to include plural forms unless the context clearly indicates otherwise. It should also be understood that the terms "consist of" and/or "include", when used in the description, determine the existence of the features, integers, steps, operations, elements and/or components, but do not exclude the existence or addition of one or more other features, integers, steps, operations, elements, components and/or groups. When used herein, the term "and/or" includes any and all combinations of the relevant listed items.

The present application provides a method for making a semi-floating gate transistor with a three-gate structure. Please refer to FIG. 1a to FIG. 1f, which are schematic cross sectional views of steps of the making the semi-floating gate transistor with a three-gate structure process for according to an embodiment of the present application. The method includes the following steps:

In S1, providing a semiconductor substrate, forming isolated active regions on the semiconductor substrate, forming a first-doping-type deep well in each active region, and forming a first trench structure in the first-doping-type deep well.

Specifically, referring to FIG. 1a, a semiconductor substrate 10 is provided, isolated active regions are formed on the semiconductor substrate, a first-doping-type deep well 11 is formed in each active region, and a first trench structure 12 is formed in the first-doping-type deep well 11. In an embodiment, the first-doping-type deep well 11 is an N-type doped deep well.

In an embodiment, the first trench structure 12 is a U-shaped trench structure. In an embodiment, the depth of the first trench structure 12 is in the range of 100 nm-200 nm. In an embodiment, the width of the first trench structure 12 is in the range of 30 nm-50n m.

In S2, forming a first polysilicon layer so that the first polysilicon layer fills in the first trench structure and covers a surface of the active region.

Specifically, referring to FIG. 1a, a first polysilicon layer 13 is formed so that the first polysilicon layer 13 fills in the first trench structure 12 and covers the surface of the active region.

Specifically, before the first polysilicon layer 13 is formed in S2, the method further includes S21: forming a first gate oxide layer 14, wherein the first gate oxide layer 14 covers the surfaces of the active region and the first trench structure 12. Then, the first polysilicon layer 13 is formed on the first gate oxide layer 14.

In an embodiment, the thickness of the first gate oxide layer 14 is in the range of 3 nm-5 nm. In some embodiments, the thickness of the first gate oxide layer in the range of 14 is 4 nm. In an embodiment, the thickness of the first polysilicon layer 13 is in the range of 10 nm-30 nm.

In S3, removing the first polysilicon layer 13 near two sides of the surface of the active region and the first gate oxide layer 14 under the first polysilicon layer 13 are removed, and retaining the first polysilicon layer 13 on the surface of the active region between and on sides of the first trench structures and the first gate oxide layer 14 under the first polysilicon layer 13.

Figure 1B:
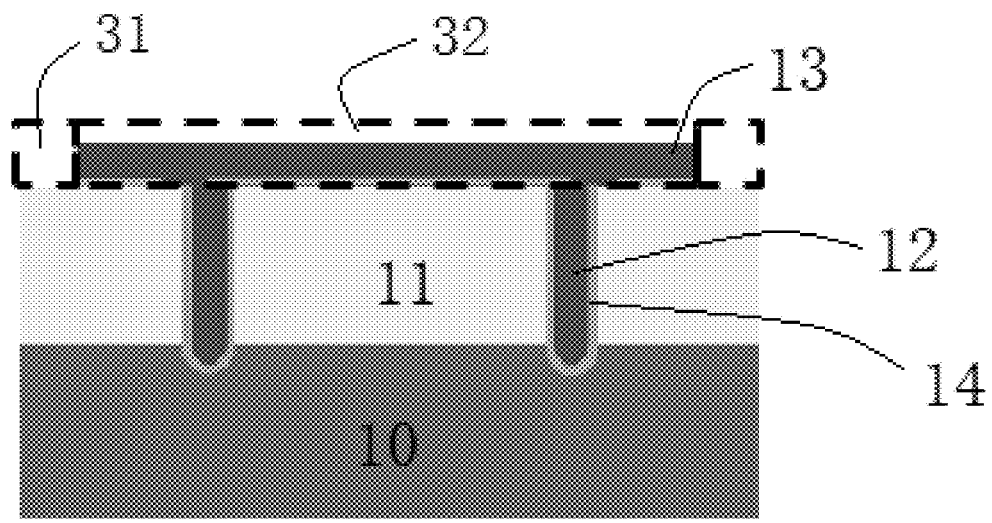

Specifically, referring to FIG. 1B, first regions 31 in the first polysilicon layer 13 and the first gate oxide layer 14 under the first polysilicon layer 13 are removed, and a second region 32 in the first polysilicon layer 13 and the first gate oxide layer 14 under the first polysilicon layer 13 are retained, that is, the remaining first polysilicon layer 13 and the first gate oxide layer 14 under the remaining first polysilicon layer 13 cover the surface of the active region between the first trench structures 12 and the surface of the active region on two sides of the first trench structures 12.

In an embodiment, the first polysilicon layer 13 and the first gate oxide layer 14 under the first polysilicon layer 13 are removed by a photolithography and etching process in S3.

In S4, forming a second gate oxide layer so that the second gate oxide layer covers the surface of the exposed active region and side surfaces and an upper surface of the first polysilicon layer, and forming a second polysilicon layer, wherein the second polysilicon layer covers the second gate oxide layer.

Figure 1C:
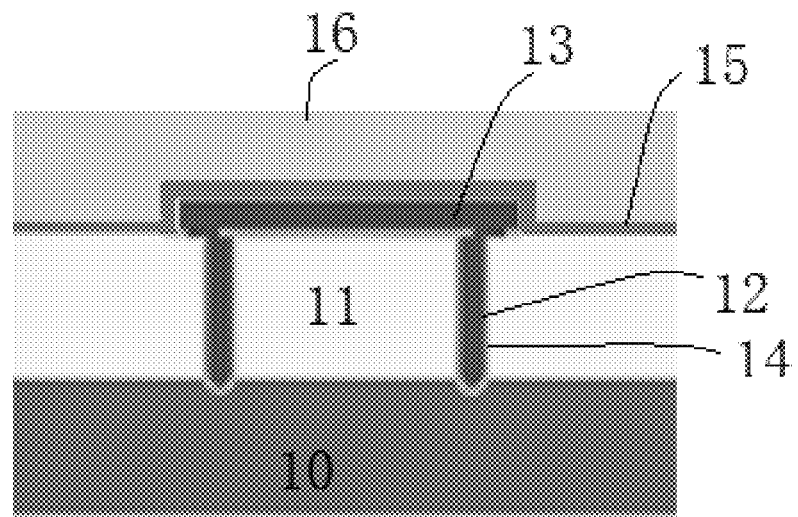

Referring to FIG. 1c, the second gate oxide layer 15 covers the surface of the exposed active region and side surfaces and an upper surface of the first polysilicon layer 13, and the second polysilicon layer 16 covers the second gate oxide layer 15.

In an embodiment, the thickness of the second polysilicon layer is in the range of 30 nm-80 nm.

In S5, forming a photoresist layer, forming an isolation trench pattern through a lithographic exposure and development process, wherein the isolation trench pattern is located on the both sides of the remaining first polysilicon layer, and removing the second polysilicon layer 16 and the second gate oxide layer 15 in the isolation trench patterns until the active region at the bottom of the isolation trench patterns and sidewalls of the first polysilicon layer 13 are lithographically exposed, so that isolation trenches 17 are formed at the isolation trench patterns.

Figure 1D:
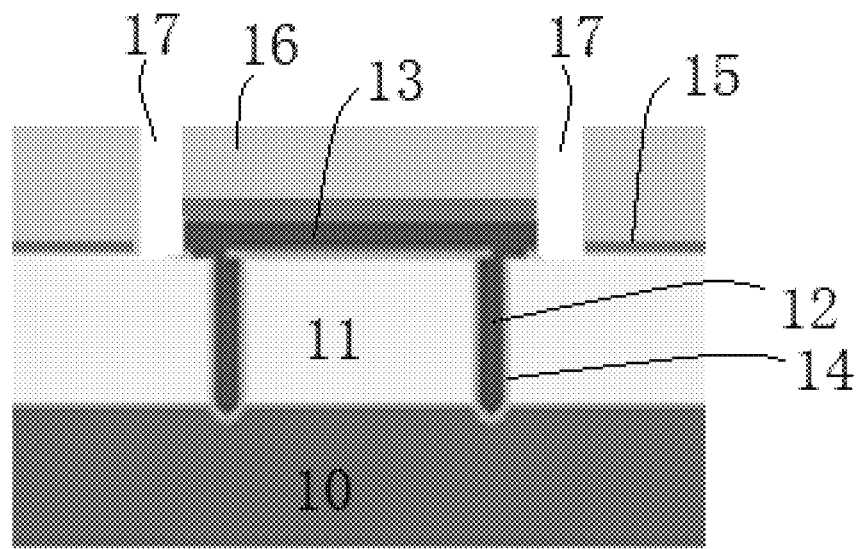
Figure 1E:
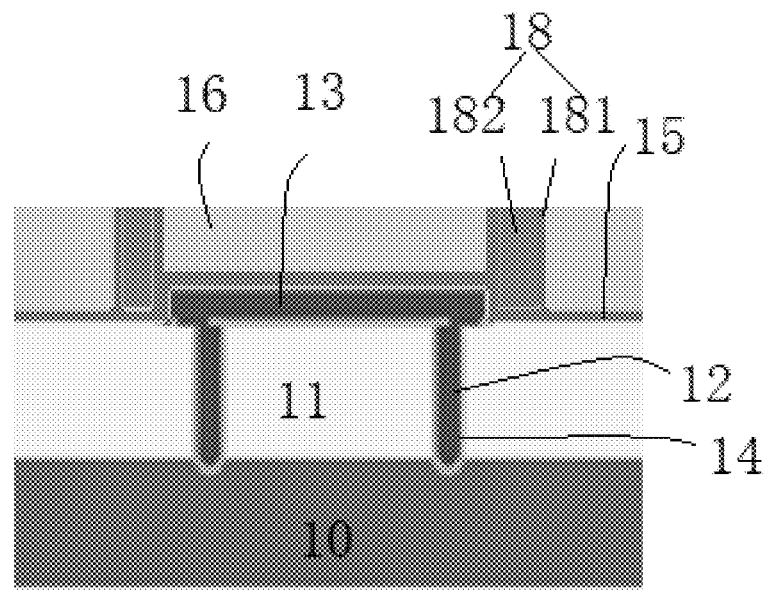
Figure 1F:
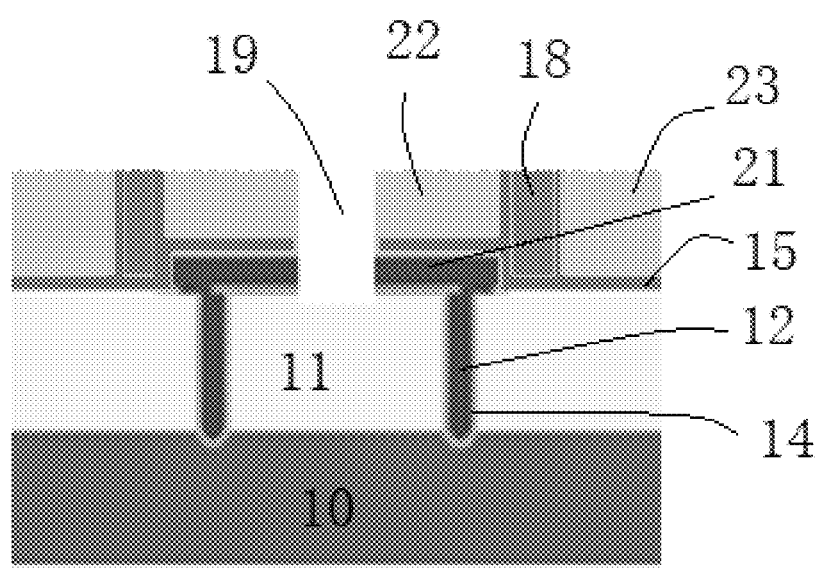

Referring to FIG. 1d, each of the isolation trenches 17 are located on two sides of the remaining first polysilicon layer and exposes the sidewalls of the first polysilicon layer 13.

In an embodiment, the width of the isolation trench 17 is in the range of 20 nm-50 nm.

In S6, an isolation dielectric layer 18 is filled in the isolation trench 17.

In an embodiment, the isolation dielectric layer 18 includes a first isolation dielectric layer 181 and a second isolation dielectric layer 182.

In S7, forming a trench 19 between two first trench structures 12, wherein the trench 19 cuts open the second polysilicon layer 16, the second gate oxide layer 15, the first polysilicon layer 13 and the first gate oxide layer 14 between the first trench structures 12 into two parts. The active region is exposed from the bottom of the trench 19, so the portions of the first polysilicon layer 13 on each side of the trench forms a first gate 21, and portions of the second polysilicon layer 16 on both sides of the isolation trench 17 respectively forms a second gate 22 and a third gate 23.

In this way, the second gate and the third gate in the three-gate structure are successfully fabricated at the same time through the polysilicon etching process. Based on the existing 28 LP/28 HK process platform, a process can be developed that is compatible with the 28 LP/28 HK process and meets the requirements of making semi-floating gate transistor devices with a three-gate structure. It has the advantages of fewer process steps, simpler process flow and integration.

The method for making the semi-floating gate transistor with the three-gate structure provided by the present application may further include a process in which at least one of the second polysilicon gate and the third polysilicon gate are replaced with a metal gate through a gate-last process.

Specifically, a layer of thin film is deposited after the step of S7, then sidewalls are formed on two sides of the second gate and the third gate through dry etching to protect the sidewalls of the second gate and the third gate and support the second gate and the third gate, the region of the second gate and/or the third gate is exposed through a lithography process, the second gate and/or the third gate is removed through dry etching to form a trench of the region of the second gate and/or the third gate respectively wrapped by sidewalls on two sides, and a metal gate is deposited in the trench of the region of the second gate and/or the third gate to form a semi-floating gate device transistor with a three-gate structure in which at least one gate is a metal gate.

Finally, it should be noted that the above embodiments are only used to describe rather than limit the technical solution of the present application. Although the present application has been described in detail with reference to the above embodiments, those skilled in the art should understand that modifications may be made to the technical solution recorded in each embodiment, or equivalent replacements may be made to some or all of the technical features. However, these modifications or replacements do not make the essence of the corresponding technical solution deviate from the scope of the technical solution in each embodiment of the present application.

What is claimed is:

1. A method for making a semi-floating gate transistor with a three-gate structure, wherein the method comprises:
   S1: providing a semiconductor substrate, forming isolated active regions on the semiconductor substrate, forming a first-doping-type deep well in each of the active regions, and forming a first trench structure in the first-doping-type deep well;
   S2: forming a first gate oxide layer, wherein the first gate oxide layer covers surfaces of the active region and the first trench structure, and forming a first polysilicon layer over the first gate oxide layer, wherein the first polysilicon layer fills the first trench structure;
   S3: removing the first polysilicon layer from two sides of the surface of the active region, and retaining the first polysilicon layer on the surface of the active region, as well as between the first trench structures and the first gate oxide layer under the first polysilicon layer;
   S4: forming a second gate oxide layer, wherein the second gate oxide layer covers the surface of an exposed active region, side surfaces and an upper surface of the first polysilicon layer, and forming a second polysilicon layer, wherein the second polysilicon layer covers the second gate oxide layer;
   S5: forming a photoresist layer, forming an isolation trench pattern through a lithographic exposure and development process, wherein the isolation trench pattern is located between two sides of the remaining first polysilicon layer; and removing the second polysilicon layer and the second gate oxide layer in the isolation trench pattern until the active region is exposed from a bottom of the isolation trench pattern and the side surfaces of the first polysilicon layer, so that an isolation trench is formed from the isolation trench pattern;
   S6: filling an isolation dielectric layer in the isolation trench;
   S7: forming a trench between two first trench structures, wherein the trench cuts open the second polysilicon layer, the second gate oxide layer, the first polysilicon layer and the first gate oxide layer between the first trench structures into two parts, so that the active region is exposed from a bottom of the trench, wherein the first polysilicon layer on either side of the trench forms a first gate, and wherein portions of the second polysilicon layer on both sides of the isolation trench respectively form a second gate and a third gate;
   S8: depositing a layer of thin film; forming sidewalls on two sides of the second gate or the third gate through dry etching for protection and for strengthening the second gate or the third gate;
   S9: exposing an area of the second gate or the third gate by a lithography process;
   S10: removing the second gate or the third gate by a dry etching process to form a trench in the second gate or the third gate which is supported on two sides by the sidewalls; and
   S11: depositing a metal gate in the trench of the second gate or the third gate to form the semi-floating gate transistor with the three-gate structure comprising at least one metal gate.

2. The method for making the semi-floating gate transistor with the three-gate structure according to claim 1, wherein the first-doping-type deep well is an N-type doped deep well.

3. The method for making the semi-floating gate transistor with the three-gate structure according to claim 1, wherein the first trench structure is a U-shaped trench structure.

4. The method for making the semi-floating gate transistor with the three-gate structure according to claim 3, wherein a depth of the first trench structure is in a range of 100 nm-200 nm and a width is in a range of 30 nm-50 nm.

5. The method for making the semi-floating gate transistor with the three-gate structure according to claim 1, wherein a thickness of the first gate oxide layer is in a range of 3 nm-5 nm.

6. The method for making the semi-floating gate transistor with the three-gate structure according to claim 1, wherein a thickness of the first polysilicon layer is in a range of 10 nm-30 nm.

7. The method for making the semi-floating gate transistor with the three-gate structure according to claim 1, wherein a thickness of the second polysilicon layer is in a range of 30 nm-80 nm.

8. The method for making the semi-floating gate transistor with the three-gate structure according to claim 1, wherein a width of the isolation trench is in a range of 20 nm-50 nm.

* * * * *